US006989983B2

(12) United States Patent
Rumney (10) Patent No.: US 6,989,983 B2
(45) Date of Patent: Jan. 24, 2006

(54) MOUNTING ARRANGEMENT FOR DEMOUNTABLE UNITS

(75) Inventor: Gary Simon Rumney, Kuei San Hsiang (TW)

(73) Assignee: Sun Microsystems, Inc., Santa Clara, CA (US)

( * ) Notice: Subject to any disclaimer, the term of this patent is extended or adjusted under 35 U.S.C. 154(b) by 174 days.

(21) Appl. No.: 10/607,851

(22) Filed: Jun. 27, 2003

(65) Prior Publication Data

US 2004/0264116 A1 Dec. 30, 2004

(51) Int. Cl.
*H05K 5/00* (2006.01)
(52) U.S. Cl. ........................... 361/679; 361/685
(58) Field of Classification Search ........ 361/685–686, 361/679
See application file for complete search history.

(56) References Cited

U.S. PATENT DOCUMENTS

| | | | |
|---|---|---|---|
| 5,748,442 A | * | 5/1998 | Toor .......................... 361/685 |
| 6,084,768 A | * | 7/2000 | Bolognia ..................... 361/685 |
| 6,252,765 B1 | | 6/2001 | Balzaretti et al. |
| 6,299,266 B1 | | 10/2001 | Justice et al. |
| 6,636,422 B1 | * | 10/2003 | Tanzer et al. ............... 361/687 |
| 6,853,546 B2 | | 2/2005 | Rabinovitz |

* cited by examiner

*Primary Examiner*—Yean-Hsi Chang
(74) *Attorney, Agent, or Firm*—Meyertons Hood Kivlin Kowert & Goetzel, P.C.; B. Noël Kivlin (57) ABSTRACT

There is described an arrangement for mounting removable components to electronics module of rack-mountable modular electronic circuits. The removable component is surrounded by a latching collar provided with resilient latching arms, the latching arms having detent surfaces which, when the removable component is fully inserted, engage interior surfaces of the module housing to prevent withdrawal. Gripping tabs attached to the latching arms extend outwardly through the insertion opening so as to be accessible when the module is mounted in a rack, the gripping tabs being operable to release the detents and permit withdrawal of the removal component without removing the module from the rack. The mounting arrangement is particularly applicable to DVD or other media drives, but can be used for other components such as power supplies.

18 Claims, 5 Drawing Sheets

MOUNTING ARRANGEMENT FOR DEMOUNTABLE UNITS

BACKGROUND OF THE INVENTION

The present invention relates to rack-mounted modular electronics assemblies, and is primarily concerned with facilitating the mounting and demounting of removable units such as media drives, power supplies, etc. to and from modules of a rack mounted assembly. Specifically, the invention is concerned with providing a means for tool-free mounting and demounting of removable sub-assemblies, while providing electromagnetic radiation shielding to the assemblies when mounted.

In rack mounted modular electronics systems, each module comprises a housing which contains a number of sub-assemblies such as power supplies, media drives, processing units, memory units, etc. connected to a motherboard which is mounted within the module housing. In order to minimise downtime due to faults, many of the assemblies are made removable from the module so that they can be easily replaced when faulty. In the case of media drives such as CD ROM or DVD drives, which are substantially rectangular planar units having a front flange and a rearwardly facing electrical connection on the side opposite the front flange. To mount such a media drive in a module of a rack-mounted system, the module is provided on its front face with an opening through which the media drive is insertable, and internally the module is provided with a sleeve aligned with the opening and dimensioned closely to surround the media drive. The sleeve is provided at its end remote from the opening with an electrical connector which is aligned and engaged with the connector of the media drive when the drive is inserted into the module. Typically, the drive is secured to the module either by fasteners attaching the front flange of the drive to the front face of the module housing, and has a drive retaining means provided at the end of the sleeve adjacent the electrical connection.

If the drive is to be removed for replacement, then it is either necessary to use tools to remove the fasteners in the drive flange, or it is necessary to remove the module from the rack, open the module and disengage the retaining means at the other end of the drive.

In either case, this demounting method is time-consuming and increases the downtime of the module.

To provide electromagnetic radiation shielding between the sleeve and the module, the sleeve is conventionally provided with resilient contacting fingers which engage the surface of the media drive. These fingers are relatively fragile and are easily damaged when the drive is inserted and removed. If the fingers become damaged, then the sleeve will need to be replaced which is a major operation requiring disassembly of the module housing.

The present invention seeks to provide a mounting arrangement for mounting removable sub-assemblies in electronics modules, the mounting arrangement providing for tool-free removal of the demountable units and reliable electromagnetic radiation protection.

SUMMARY OF THE INVENTION

A first aspect of the present invention provides a mounting arrangement for mounting a removable component to a module of a rack-mounted modular electronic circuit having an insertion opening for the removable component, comprising:

a mounting sleeve into which the removable component is insertable in an insertion direction; and a latching collar attachable to the removable component; wherein the mounting sleeve is fixable in the module in alignment with the insertion opening;

and wherein the latching collar is adapted closely to surround the removable component and comprises a resilient latching arm extending outwardly from the collar and having a detent surface facing in a direction opposite the insertion direction and a gripping tab;

the arrangement being such that the latching collar passes through the insertion opening and into the mounting sleeve as the removable component is inserted into the mounting sleeve, and the detent surface of the collar engages an interior engagement surface adjacent the insertion opening to prevent movement of the removable component in a direction opposite to the insertion direction and the gripping tab extends out through the insertion opening when the removable component is fully inserted.

Another aspect of the invention provides a housing for a module of a rack-mountable electronic circuit, comprising:

a front face accessible when the module is mounted in a rack;

an insertion opening formed in the front face;

a mounting sleeve mounted within the module in alignment with the insertion opening; and an engagement surface adjacent the insertion opening and facing inwardly of the housing, for engaging a detent surface of a latching arm of a latching collar mounted to a removable component insertable through the insertion opening and receivable in the mounting sleeve.

Third and fourth aspects of the invention provide a module, and a modular electronic circuit, in which such module housings are used.

A fifth aspect of the invention provides a latching collar for mounting to a removable component of an electronics module, wherein gripping tabs of resilient latching arms of the collar extend out of the insertion opening for the removable component when the component is fully inserted, the gripping tabs being operable to release the detents which hold the removable component against withdrawal.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Referring now to the drawings, in which like reference numerals are used to designate corresponding elements.

Figure 1:
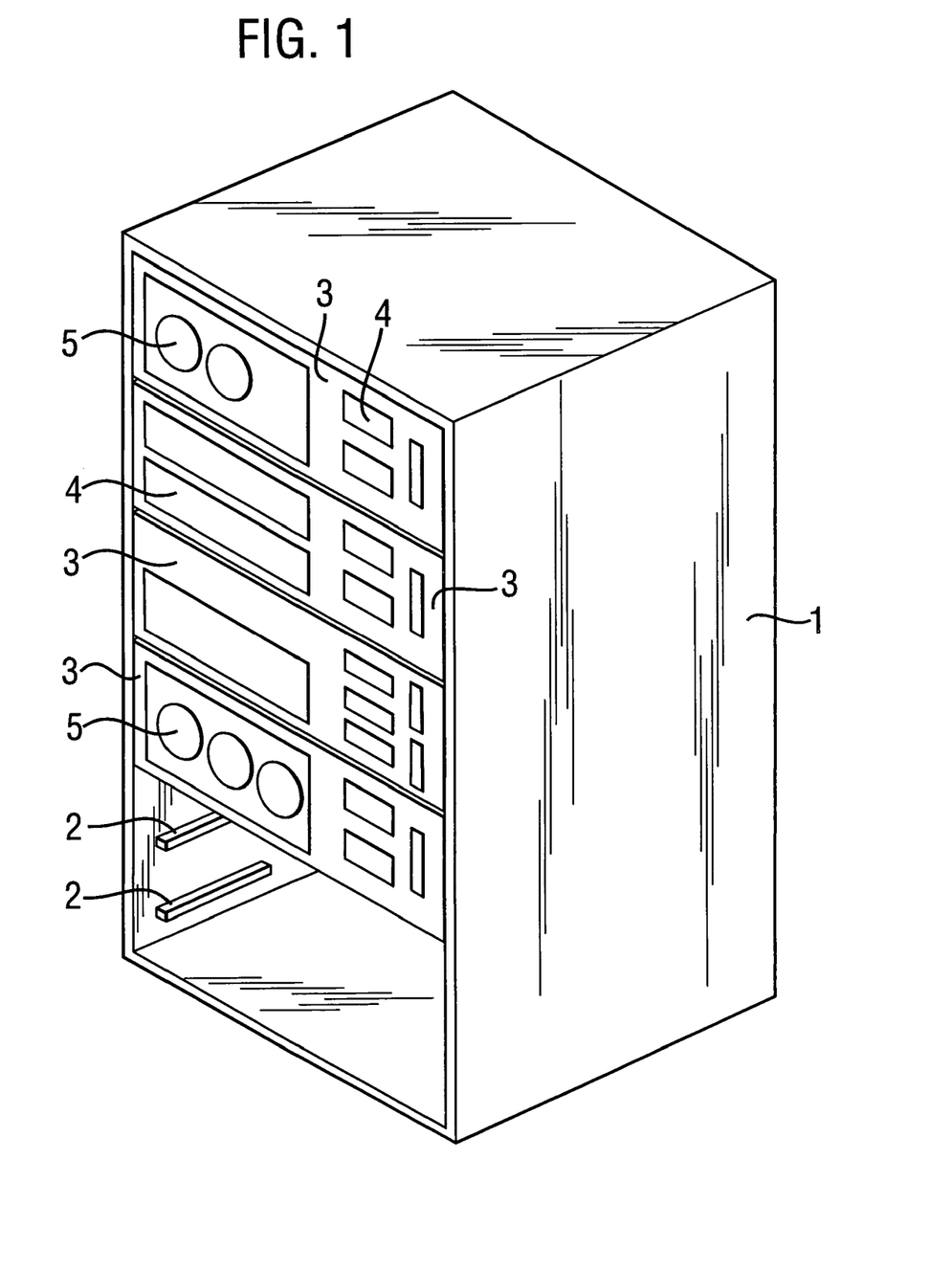
FIG. 1 is a perspective view of a rack-mounted modular electronic circuit assembly.

FIG. 1 is a perspective view of a rack-mounted electronics system comprising a cabinet 1 including a plurality of mounting rails 2 on which electronic modules 3 are removably mountable. To the exposed front faces of the modules 3, sub-assemblies such as media drives 4 and fan assemblies 5 may be mounted. The electrical connections to the modules are made via a wiring loom installed in the cabinet 1 and provided with connectors cooperable with connectors provided at the rear faces of the electronics modules 3.

Figure 2:
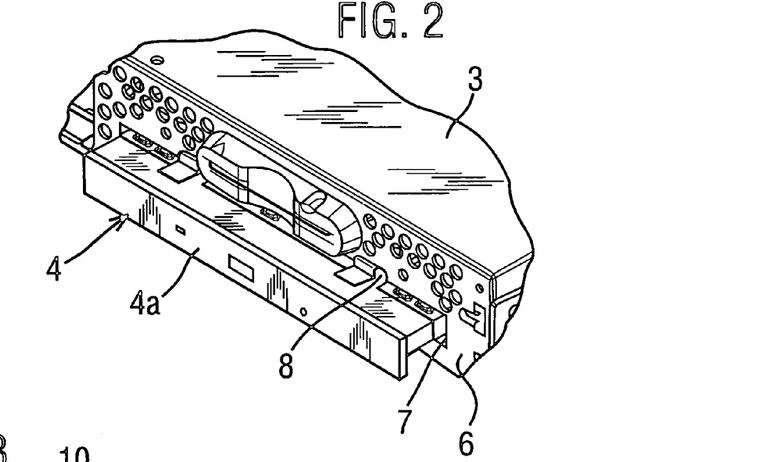
FIG. 2 is a partial perspective view of a circuit module, showing a DVD ROM drive partially demounted.

FIG. 2 shows a partial perspective view of an embodiment of a module 3. The front face 6 of the module 3 is formed with an opening 7 dimensioned to receive a media drive 4. The media drive 4 is a generally rectangular planar unit having a front flange 4a extending perpendicularly to the plane of the unit.

As can be seen in FIG. 2, the opening 7 is elongate and has a pair of recesses 8 extending from one of its longer sides.

Mounted to the inner surface of the front face 6 of the module 3 is a mounting sleeve 10. The mounting sleeve comprises a top wall 11, a pair of side walls 12 extending downwardly from the top wall 11 and a rear wall 13. The side walls 12 have inwardly-extending flanges 14 at their lower edges, and the rear wall 13 has an inwardly-extending flange 15 co-planar with the flanges 14. In the embodiment shown in FIGS. 2 to 4, the mounting sleeve 10 is positioned within the module so that the flanges 14 and 15 are attachable to the base of the module housing, thus providing a totally enclosed structure for containing the media drive 4. The mounting sleeve 10 is preferably made from metallic material, as is the housing of the module 3, so that the media drive 4 is effectively shielded against electromagnetic radiation.

Figure 3:
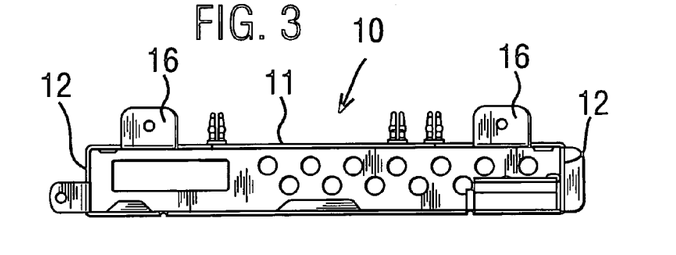
FIG. 3 is a front view of a mounting sleeve.
Figure 4:
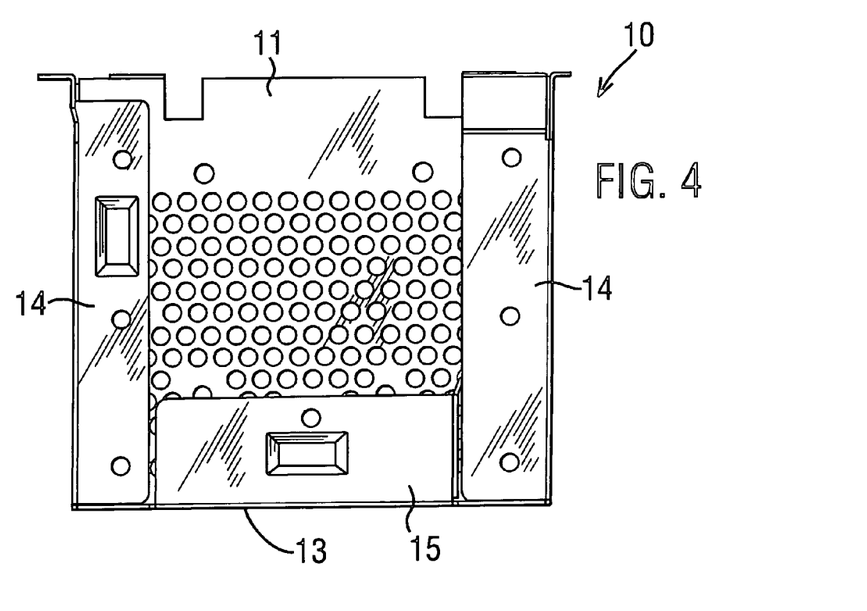
FIG. 4 is an underneath view of the mounting sleeve of FIG. 2.

At the front edge of the top wall 11, the mounting sleeve 10 comprises a pair of upstanding fixing lugs 16. The fixing lugs 16 are provided with holes 16a to accept fasteners for securing the fixing lugs 16 to the front wall 6 of the module housing. The lugs 16 may be fixed by means of a screw or bolt 17, or by means of a rivet or other suitable fastener. The lug 16 may alternatively be permanently fixed to the front face 6 by welding or adhesive bonding.

As an alternative to the flanges 14 and 15, the mounting sleeve 10 may be provided with a continuous bottom wall attached to the lower edges of the side walls 12 and/or the rear wall 13.

Figure 5:
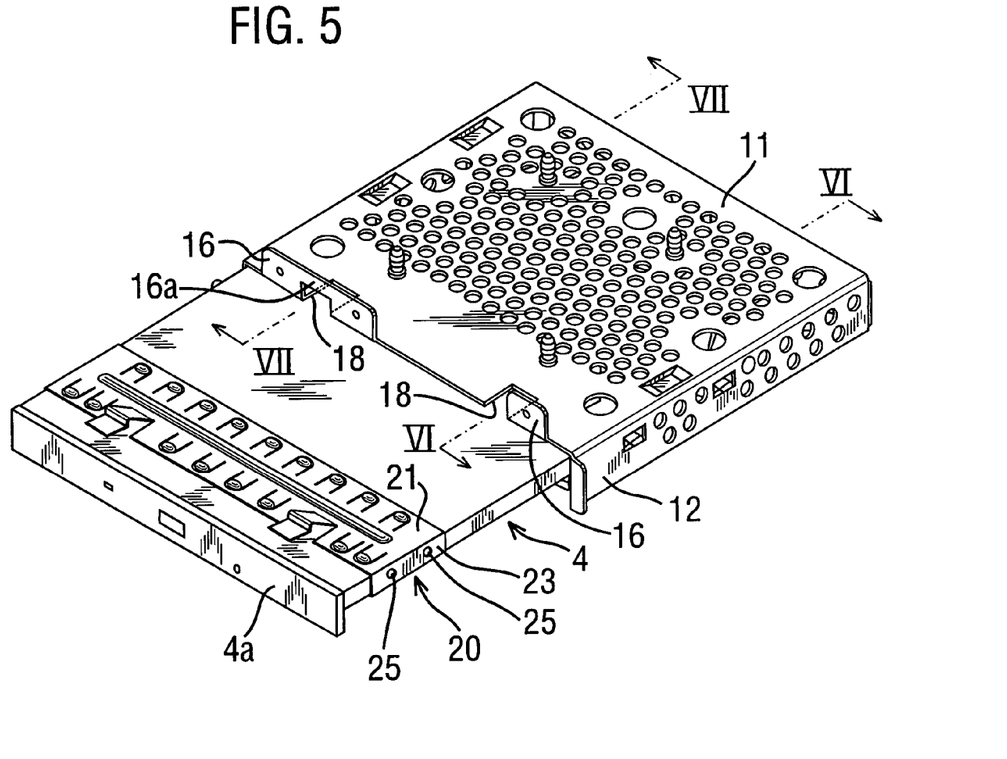
FIG. 5 is a perspective view of a mounting sleeve and a DVD ROM drive partially inserted therein.

As can be seen in FIG. 5, the top wall 11 of the mounting sleeve 10 comprises a pair of cutouts 18 positioned adjacent to the mounting lugs 16 and corresponding to the positions of the recesses 8 in the front face 6 of the module. The purpose of these cut outs 18 will be described later.

Figure 8:
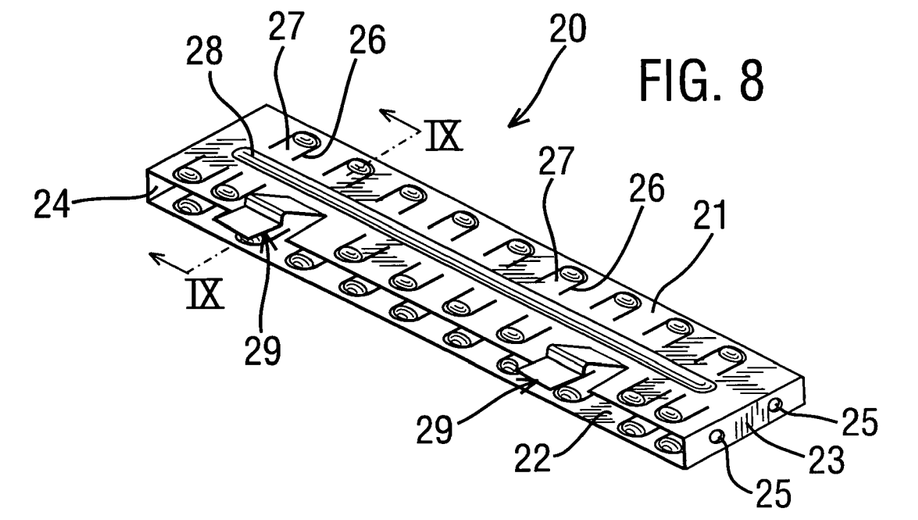
FIG. 8 is a perspective view of a latching collar for a DVD ROM drive.
Figure 9:
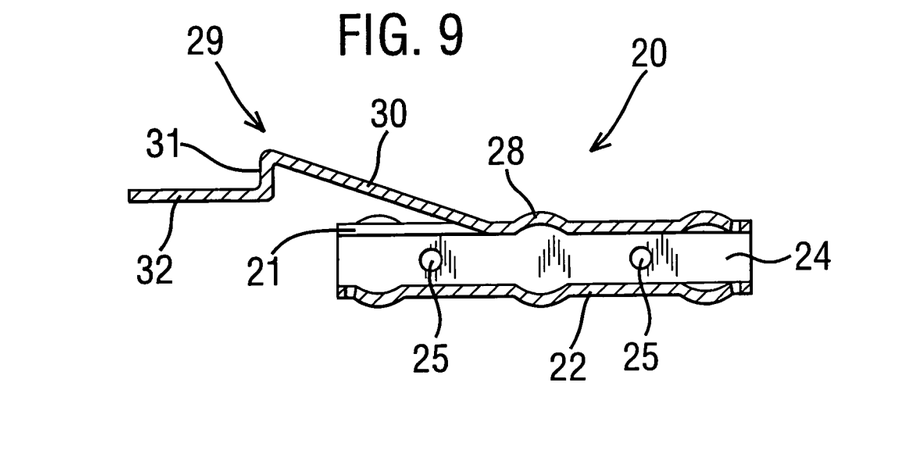
FIG. 9 is a sectional view in the plane IX—IX of FIG. 8.

Referring now to FIG. 5, the DVD drive 4 is provided with a latching collar 20, shown in perspective view in FIG. 8 and in sectional view in FIG. 9.

The latching collar 20 is formed from a strip of resilient metallic material, shaped closely to surround the DVD drive 4. The latching collar 20 comprises an upper strip 21 and a lower strip 22, joined at their respective ends by end walls 23 and 24.

The end walls 23 and 24 are provided with mounting holes 25 through which fasteners may pass to attach the collar 20 securely to the DVD drive 4.

The upper and lower strips 21 and 22 are formed with a series of "C" shaped slits 26, which define resilient contacting fingers 27. The free ends of the fingers 27 are made slightly convex outwards, by pressing the sheet material of the latching collar 20. As can be seen in FIGS. 5 and 8, the upper and lower strips 21 and 22 of the latching collar are each formed with two rows of contact fingers 27, the fingers 27 being attached to the strips 21 and 22 at the central regions of the strips and having their free ends arranged the adjacent the edges of the strips. A central stiffening element 28 is formed by pressing the material of the respective upper and lower strips 21 and 22 into a convex rib. It will be understood that although the stiffening element 28 is shown as a convex rib, it may equally be formed by an inwardly-convex rib resulting in a concavity in the exterior surface of the upper and lower strip 21. Such an inwardly-projecting rib will ensure close electrical contact between the latching collar 20 and the casing of the DVD drive 4.

The latching collar 20 is formed with a pair of resilient latching arms 29, spaced apart to correspond with the spacing of the recesses 8 and the cutouts 18 in the front face 6 of the module and the top wall 11 of the mounting sleeve 10, respectively. Each latching arm 29 comprises an upwardly and outwardly projecting cantilever arm 30, a depending detent 31 at the free end of the cantilever arm 30 and a gripping tab 32. The gripping tab 32 extends outwardly from the detent 31. While the illustrated embodiment comprises two latching arms 29, it will be understood that a single latching arm may be provided, or three or more latching arms 29 may extend from the collar 20.

The latching collar 20 is preferably formed from metallic strip material by conventional pressing, slitting and bending techniques.

The mounting of a DVD drive in a module using the mounting sleeve and latching collar will now be described.

The mounting sleeve 10 is attached to the housing of the module 3, with the cut outs 18 in the top wall of the mounting sleeve 10 aligned with the recesses 8 extending from the opening 7 in the front face 6 of the module 3.

The DVD drive 4 is provided with a latching collar 20, which closely surrounds the DVD drive 4 and is fixed thereto by means of fasteners passing through the mounting holes 25 in the latching collar 20.

To mount the DVD drive to the module, the drive 4 is presented to the opening 7 and inserted therethrough into the mounting sleeve 10. As the latching collar 20 enters the mounting sleeve 10, the free ends of the contact fingers 27 engage the interior surfaces of the mounting sleeve 10 to make electrical contact therewith, thus ensuring effective electromagnetic radiation shielding of the DVD drive. As the drive is pushed fully home into the mounting sleeve 10, the cantilever arms 30 of the latching arms 29 engage the edges of the recesses 8, and are urged resiliently downwards by a camming action as the DVD drive is inserted. When the free ends of the cantilever arms 30 pass through the opening 7, the cantilever arms 30 spring back so that the detents 31 of the latching arms 29 engage the interior surface of the front face 6 of the module, as shown in the section view in FIG. 6. The gripping tabs 32 of the latching arms 29 project through the recesses 7 so as to be accessible from the exterior of the front face 6 of the module 3. Engagement of the detents 31 with the front face 6 of the module prevents removal of the DVD drive 4 from the mounting sleeve 10, and ensures that electrical connections at the rear of the DVD drive 4 are held in contact with electrical connections in the sleeve 10.

Figure 6:
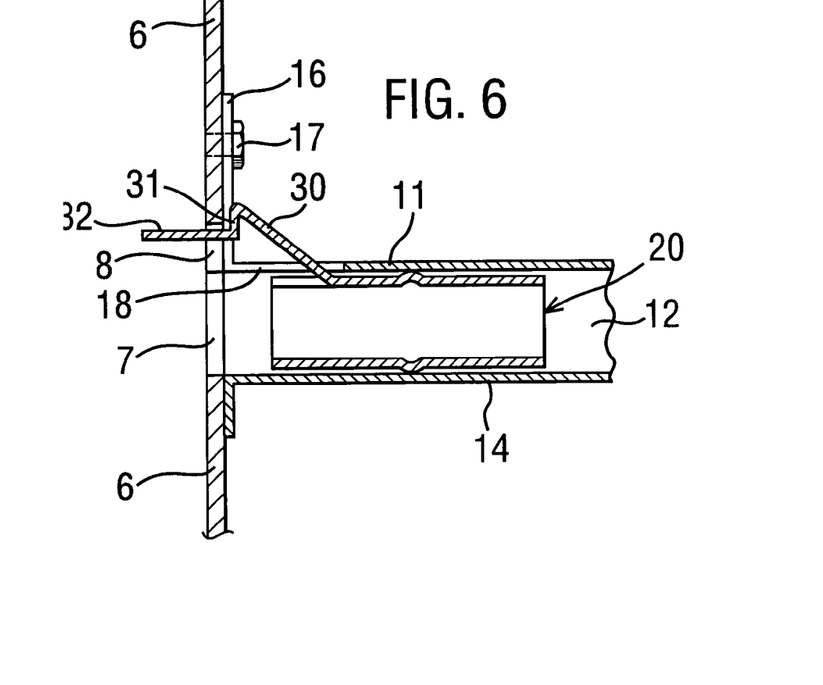
FIG. 6 is a partial sectional view taken in the plane VI—VI of FIG. 5.

The arrangement shown in FIG. 6 relates to the mounting lug 16 and cutout 18 shown at the right hand side of the mounting sleeve 10 of FIG. 5. The mounting lug 16 on the left hand side of the mounting sleeve of FIG. 5 is extended to form a bridge passing over the cutout 18, the central part 16a of the bridge being spaced from the top wall 11 of the mounting sleeve 10. This arrangement of the mounting lugs 16 simplifies the structure of the module, since it enables the mounting sleeve 10 to be used with a plane rectangular opening 7 in the front face 6 of the module. In this arrangement, the detent 31 of the latching arm 29 engages with the interior surface of the central portion 16a of the mounting lug 16, rather than engaging the interior surface of the front face 6 of the module 3. In the sectional view of FIG. 7, the mounting lug 16 is attached to the front face 6 of the module by means of a fastener 17. The opening 7 formed in the front face 6 is a rectangular opening with no recesses 8, but the height of the rectangular opening 7 is sufficient to afford clearance for the cantilever arm 30 and detent 31 of the latching arm 29.

Figure 7:
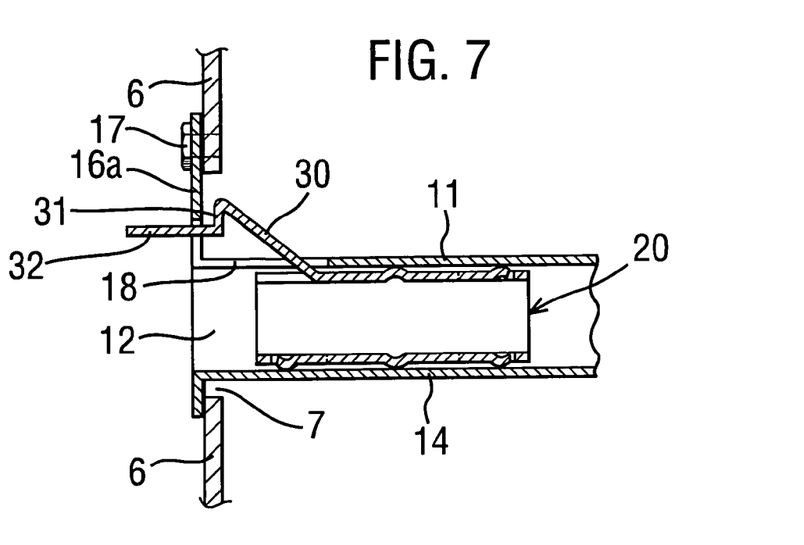
FIG. 7 is a partial sectional view taken in the plane VII—VII of FIG. 5.

Insertion of the DVD drive into the mounting sleeve 10 is effected in the same way as described above, with the difference that the cantilever arm 30 engages the central portion 16a of the mounting lug 16 as the DVD drive is pushed home. When the free end of the cantilever arm 30 has passed under the mounting lug 16, the latching arm 29 resiliently springs back so that the detent 31 can engage the central portion 16a of the mounting lug 16 with the gripping tab 32 extending under the bridge portion 16a.

To remove the DVD drive 4 from the module 3, the gripping tabs 32 are pushed downwardly, bending the cantilever arms 30 downwardly to disengage the detents 31 from the front face 6 of the module 3, or from the central portions 16a of the mounting lug 16, respectively. The DVD drive may then simply be withdrawn from the mounting sleeve. Any damage caused to the contact fingers 27 of the latching collar 20 due to the sliding movement of the contact fingers in engagement with the mounting sleeve is easily repaired, simply by removing the latching collar 20 from the DVD drive 4 and replacing it. In practice, however, since the DVD drive 4 is being replaced the new DVD drive 4 will already be fitted with a new latching collar 20. Replacement of the DVD drive 4 thus results in replacement of the latching collar 20 and any damage to the contact fingers 27 is corrected.

If the latching collar 20 of the discarded DVD drive 4 is undamaged, it may be removed from the DVD drive 4 for reuse by removing the fasteners from the mounting holes 25.

It will be appreciated that although the latching arms 29 are described in relation to the upper surface of the DVD drive, the assembly may be inverted so that the latching arms 29 are beneath the DVD drive 4. In this case, the opening 7 in the front face 6 of the module 3 will be formed with its recesses 8 on the underside of the opening, or the bridge-shaped mounting lugs 16 of the mounting sleeve 10 will be formed on a bottom wall of the mounting sleeve 10 or on extended portions of the flanges 13 or 14 of the mounting sleeve 10. In a yet further alternative, the latching arms 29 may be provided one above and one below the DVD drive 4.

Although the present embodiment describes the mounting of a DVD drive, it will be understood that any demountable element can make use of the latching arrangements of the present invention, simply by dimensioning the opening 7, the mounting sleeve 10 and the latching collar 20 to fit the demountable component. In this way, other media drives such as floppy disc drives, may be made easily demountable.

The mounting sleeve 10 and latching collar 20 of the present invention may also be applied to components such as power supplies, cooling fan assemblies, or any other demountable assembly used in a rack-mounted modular electronic circuit.

Although the opening 7 in the front face 6 of the module 3 shown in FIG. 2 comprises upwardly-extending recesses 8, it will be appreciated that the opening 7 may be a simple rectangular opening whose height is equivalent to the height from the lower edge of the opening 7 to the upper edge of the recesses 8. Such an arrangement will, however, result in a large gap between the upper surface of the DVD drive 4 and the upper edge of the opening 7. The provision of recesses 8 at positions corresponding to the latching arms 29 will eliminate the unnecessary clearance between the recessed edge of the opening 7 and the corresponding edge of the DVD drive 4.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A mounting arrangement for mounting a removable component to a module of a rack-mounted modular electronic circuit having an insertion opening for the removable component, comprising:

a mounting sleeve into which the removable component is insertable in an insertion direction, wherein the mounting sleeve is attached to the module by a mounting lug extending perpendicularly to the insertion direction and engageable with the module at a region adjacent the insertion opening; and a latching collar attachable to the removable component, wherein the detent surface of the latching collar engages the mounting lug when the removable component is fully inserted;

wherein the mounting sleeve is fixable in the module in alignment with the insertion opening;

and wherein the latching collar is adapted closely to surround the removable component and comprises a resilient latching arm extending outwardly from the collar and having a detent surface facing in a direction opposite the insertion direction and a gripping tab;

the arrangement being such that the latching collar passes through the insertion opening and into the mounting sleeve as the removable component is inserted into the mounting sleeve, and the detent surface of the collar engages an interior engagement surface adjacent the insertion opening to prevent movement of the removable component in a direction opposite to the insertion direction and the gripping tab extends out through the insertion opening when the removable component is fully inserted.

2. A mounting arrangement according to claim 1, wherein the latching collar is provided with two or more latching arms.

3. A mounting arrangement according to claim 1, wherein the latching collar is formed with resilient contact fingers adapted to engage the interior of the mounting sleeve.

4. A mounting arrangement according to claim 3, wherein the latching collar has an inwardly projecting contact to engage, and electrically connect the collar to, the removable component.

5. A mounting arrangement according to claim 1, wherein the latching collar is provided with two or more latching arms, and wherein the mounting sleeve is attached to the module by a mounting lug extending perpendicularly to the insertion direction and engageable with the module at a region adjacent to the insertion opening.

6. A mounting arrangement according to claim 1, wherein the latching collar is provided with two or more latching arms, and wherein the latching collar is formed with resilient contact fingers adapted to engage the interior of the mounting sleeve.

7. A mounting arrangement according to claim 1, wherein the mounting sleeve is attached to the module by a mounting lug extending perpendicularly to the insertion direction and engageable with the module at a region adjacent to the insertion opening, wherein the latching collar is formed with resilient contact fingers adapted to engage the interior of the mounting sleeve.

8. A housing for a module of a rack-mountable electronic circuit, comprising:
   a front face accessible when the module is mounted in a rack;
   an insertion opening formed in the front face;
   a mounting sleeve mounted within the module in alignment with the insertion opening, wherein the mounting sleeve is attached to the module by a mounting lug extending perpendicularly to the insertion direction and engageable with the module at a region adjacent the insertion opening; and
   an engagement surface adjacent the insertion opening and facing inwardly of the housing, for engaging a detent surface of a latching arm of a latching collar mounted to a removable component insertable through the insertion opening and receivable in the mounting sleeve, wherein the latching arm includes a gripping tab that extends out through the insertion opening when the removable component is fully inserted, and wherein the detent surface of the latching collar engages the mounting lug when the removable component is fully inserted.

9. A housing according to claim 8, wherein the insertion opening is formed with one or more outwardly extending recesses, and an engagement surface is positioned adjacent the end of each recess remote from the opening.

10. A housing according to claim 8, wherein the mounting sleeve is attached to the front farce of the module housing by means of a mounting lug, and the engagement surface is formed on the mounting lug.

11. An electronics module for a rack-mountable electronic circuit, comprising one or more electronic circuits contained in a housing according to claim 8.

12. An electronic circuit comprising at least one electronics module according to claim 11.

13. A housing according to claim 8, wherein the mounting sleeve is attached to the front face of the module housing by means of a mounting lug, and the engagement surface is formed on the mounting lug, and wherein the module is an electronics module for the rack mounted circuit, the electronics module comprising one or more electronic circuits.

14. A mounting collar for mounting a removable component to an electronics module of a modular rack-mountable electronic circuit, the collar comprising a strip of resilient electrically conductive material shaped in a loop to surround the removable component, and formed with at least one resilient latching arm extending transversely of the strip and outwardly of the loop, the latching arm comprising a detent surface facing away from the strip and a gripping tab extending from the detent surface in a direction away from the strip, wherein the gripping tab is configured, when the removable component is fully inserted of a mounting rack, to extend through an insertion opening in a front face of the mounting rack, wherein a mounting sleeve is attached to the electronics module by a mounting lug extending perpendicularly to an insertion direction and engageable with the electronics module at a region adjacent the insertion opening and wherein the detent surface of the mounting collar engages the mounting lug when the removable component is fully inserted.

15. A mounting collar according to claim 14, wherein the strip is formed with resilient electrical contact fingers protruding outwardly from the loop.

16. A mounting collar according to claim 14, wherein the loop is rectangular in form, having two parallel longer sides and two parallel shorter sides.

17. A mounting collar according to claim 14, wherein the sides are dimensioned so that the loop closely surrounds a DVD drive.

18. A mounting collar according to claim 14, wherein the strip is formed with resilient electrical contact fingers protruding outwardly from the loop, wherein the loop is rectangular in form, having two parallel longer sides and two parallel shorter sides.

* * * * *

UNITED STATES PATENT AND TRADEMARK OFFICE
CERTIFICATE OF CORRECTION

PATENT NO. : 6,989,983 B2
DATED : January 24, 2006
INVENTOR(S) : Rumney

It is certified that error appears in the above-identified patent and that said Letters Patent is hereby corrected as shown below:

Column 8,
Line 2, delete "farce" and substitute -- face --.

Signed and Sealed this

Sixteenth Day of May, 2006

JON W. DUDAS
*Director of the United States Patent and Trademark Office*